United States Patent
He et al.

(10) Patent No.: US 11,170,841 B2
(45) Date of Patent: Nov. 9, 2021

(54) APPARATUS WITH EXTENDED DIGIT LINES AND METHODS FOR OPERATING THE SAME

(71) Applicant: Micron Technology, Inc., Boise, ID (US)

(72) Inventors: Yuan He, Boise, ID (US); Sang-Kyun Park, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/802,306

(22) Filed: Feb. 26, 2020

(65) Prior Publication Data

US 2021/0264966 A1 Aug. 26, 2021

(51) Int. Cl.
| | | |
|---|---|---|
| *G11C 5/06* | (2006.01) | |
| *G11C 11/4091* | (2006.01) | |
| *H01L 27/108* | (2006.01) | |
| *G11C 11/4094* | (2006.01) | |

(52) U.S. Cl.
CPC ...... *G11C 11/4091* (2013.01); *G11C 11/4094* (2013.01); *H01L 27/10885* (2013.01); *H01L 27/10897* (2013.01)

(58) Field of Classification Search
CPC ............. G11C 11/4091; G11C 11/4094; H01L 27/10885; H01L 27/10897
USPC ........................................................ 365/149
See application file for complete search history.

(56) References Cited

U.S. PATENT DOCUMENTS

| | | | | |
|---|---|---|---|---|
| 5,973,991 A * | 10/1999 | Tsuchida | .............. | G11C 7/1072 365/202 |
| 6,049,499 A * | 4/2000 | Sukegawa | ................ | G11C 5/14 365/206 |
| 6,473,350 B2 * | 10/2002 | Lee | ........................ | G11C 7/12 365/149 |
| 6,538,946 B2 * | 3/2003 | Arai | ........................ | G11C 7/18 257/E21.656 |
| 2002/0057622 A1 * | 5/2002 | Sim | ................... | H01L 27/10897 365/230.03 |
| 2003/0231525 A1 * | 12/2003 | Mine | ................... | G11C 11/4099 365/189.07 |
| 2005/0122809 A1 * | 6/2005 | Kim | ................... | G11C 11/4094 365/203 |
| 2007/0159900 A1 * | 7/2007 | Aoki | ..................... | G11C 29/02 365/203 |
| 2008/0031068 A1 * | 2/2008 | Yoo | ..................... | G11C 11/4094 365/222 |
| 2009/0135639 A1 * | 5/2009 | Hirose | ................ | H01L 27/0207 365/72 |
| 2011/0128764 A1 * | 6/2011 | Hosoe | ................. | G11C 11/4097 365/51 |
| 2014/0022857 A1 * | 1/2014 | Miyatake | ......... | H01L 27/10897 365/208 |
| 2017/0271341 A1 * | 9/2017 | Tanaka | ............. | H01L 27/10897 |

* cited by examiner

*Primary Examiner* — Viet Q Nguyen
(74) *Attorney, Agent, or Firm* — Perkins Coie LLP

(57) ABSTRACT

Methods, apparatuses, and systems related to a memory device are described. The memory device may include a sense amplifier with a sensing circuit configured to precharge a connected extended digit line. A balancing circuit may be connected to the extended digit line opposite the sensing circuit. The balancing circuit may be configured to selectively connect the extended digit line to a precharging source to precharge the extended digit line.

24 Claims, 10 Drawing Sheets

APPARATUS WITH EXTENDED DIGIT LINES AND METHODS FOR OPERATING THE SAME

TECHNICAL FIELD

The disclosed embodiments relate to devices, and, in particular, to semiconductor memory devices with an extended digit line and methods for operating the same.

BACKGROUND

An apparatus (e.g., a processor, a memory system, and/or other electronic apparatus) can include one or more semiconductor circuits configured to store and/or process information. For example, the apparatus can include a memory device, such as a volatile memory device, a non-volatile memory device, or a combination device. Memory devices, such as dynamic random-access memory (DRAM), can utilize electrical energy to store and access data.

DETAILED DESCRIPTION

As described in greater detail below, the technology disclosed herein relates to an apparatus, such as for memory systems, systems with memory devices, related methods, etc., for utilizing extended bit lines to access word-lines and memory cells. The apparatus (e.g., a memory device and/or a system including the memory device) can include bit lines that extend from one sense amplifier location to another adjacent sense amplifier location. The bit lines can extend across word-lines between the adjacent sense amplifier locations. The bit lines can be connected to precharging circuits, such as transistors connecting the bit lines to a voltage source. For example, the voltage source can be similar to a precharging source.

For the sensing operations, the extended bit lines can be precharged from both ends. At the targeted sense amplifier, a balancing circuit (e.g., a transistor) can be activated to connect the sensing lines and the corresponding sensing nodes. The connection can precharge the resulting connected nodes. On the opposite end, the apparatus can activate the balancing circuit, thereby connecting the bit line to the precharging source. Thus, the apparatus can use longer/extended bit lines to access the word lines while maintaining precharge timing (tRP) requirements.

Figure 1:
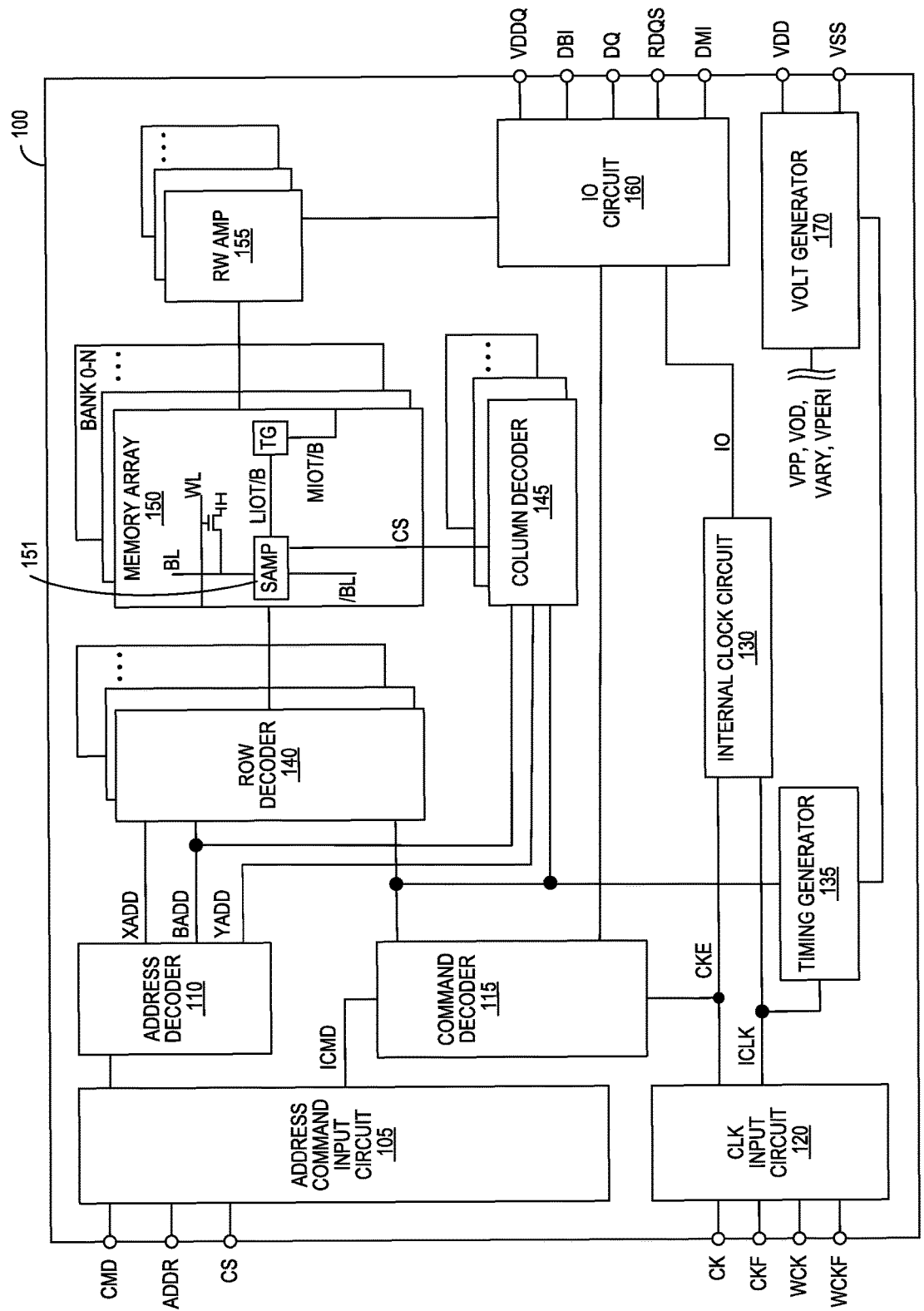
FIG. 1 is a block diagram of an apparatus in accordance with an embodiment of the present technology.

FIG. 1 is a block diagram of an apparatus 100 (e.g., a semiconductor die assembly, including a three-dimensional integration (3DI) device or a die-stacked package) in accordance with an embodiment of the present technology. For example, the apparatus 100 can include a DRAM or a portion thereof that includes one or more dies/chips.

The apparatus 100 may include an array of memory cells, such as memory array 150. The memory array 150 may include a plurality of banks (e.g., banks 0-15), and each bank may include a plurality of word-lines (WL), a plurality of bit lines (BL), and a plurality of memory cells arranged at intersections of the word-lines and the bit lines. Memory cells can include any one of a number of different memory media types, including capacitive, magnetoresistive, ferroelectric, phase change, or the like. The selection of a word-line WL may be performed by a row decoder 140, and the selection of a bit line BL may be performed by a column decoder 145. Sense amplifiers (SAMP) 151 may be provided for corresponding bit lines BL and connected to at least one respective local I/O line pair (LIOT/B), which may in turn be coupled to at least respective one main I/O line pair (MIOT/B), via transfer gates (TG), which can function as switches. The sense amplifiers 151 and transfer gates may be operated based on control signals from decoder circuitry, which may include the command decoder 115, the row decoders 140, the column decoders 145, any control circuitry of the memory array 150, or any combination thereof. The memory array 150 may also include plate lines and corresponding circuitry for managing their operation.

The apparatus 100 may employ a plurality of external terminals that include command and address terminals coupled to a command bus and an address bus to receive command signals (CMD) and address signals (ADDR), respectively. The apparatus 100 may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, and VDDQ.

The command terminals and address terminals may be supplied with an address signal and a bank address signal (not shown in FIG. 1) from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal and supply the bank address signal to both the row decoder 140 and the column decoder 145.

The command and address terminals may be supplied with command signals (CMD), address signals (ADDR), and chip select signals (CS), from a memory controller and/or a nefarious chipset. The command signals may represent various memory commands from the memory controller (e.g., including access commands, which can include read commands and write commands). The chip select signal may be used to select the apparatus 100 to respond to commands and addresses provided to the command and address terminals. When an active chip select signal is provided to the apparatus 100, the commands and addresses can be decoded, and memory operations can be performed. The command signals may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word-line and a column command signal to select a bit line. The command decoder 115 may further include one or more registers for tracking various counts or values (e.g., counts of refresh commands received by the apparatus 100 or self-refresh operations performed by the apparatus 100).

Read data can be read from memory cells in the memory array 150 designated by row address (e.g., address provided with an active command) and column address (e.g., address provided with the read). The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the apparatus 100, for example, in a mode register (not shown in FIG. 1). The read latency information RL can be defined in terms of clock cycles of the CK clock signal. For example, the read latency information RL can be a number of clock cycles of the CK signal after the read command is received by the apparatus 100 when the associated read data is provided.

Write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160 and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the apparatus 100, for example, in the mode register. The write latency WL information can be defined in terms of clock cycles of the CK clock signal. For example, the write latency information WL can be a number of clock cycles of the CK signal after the write command is received by the apparatus 100 when the associated write data is received.

The power supply terminals may be supplied with power supply potentials $V_{DD}$ and $V_{SS}$. These power supply potentials $V_{DD}$ and $V_{SS}$ can be supplied to an internal voltage generator circuit 170. The internal voltage generator circuit 170 can generate various internal potentials $V_{PP}$, $V_{OD}$, $V_{ARY}$, $V_{PERI}$, and the like based on the power supply potentials $V_{DD}$ and $V_{SS}$. The internal potential $V_{PP}$ can be used in the row decoder 140, the internal potentials $V_{OD}$ and $V_{ARY}$ can be used in the sense amplifiers included in the memory array 150, and the internal potential $V_{PERI}$ can be used in many other circuit blocks.

The power supply terminal may also be supplied with power supply potential $V_{DDQ}$. The power supply potential $V_{DDQ}$ can be supplied to the input/output circuit 160 together with the power supply potential VSS. The power supply potential $V_{DDQ}$ can be the same potential as the power supply potential $V_{SS}$ in an embodiment of the present technology. The power supply potential $V_{DDQ}$ can be a different potential from the power supply potential $V_{DD}$ in another embodiment of the present technology. However, the dedicated power supply potential $V_{DDQ}$ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a clock/enable signal from the command decoder 115, an input buffer can receive the clock/enable signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable (not shown in FIG. 1) from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as timing signals for determining output timing of read data and/or input timing of write data. The IO clock signals can be provided at multiple clock frequencies so that data can be output from and input to the apparatus 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The apparatus 100 can be connected to any one of a number of electronic devices capable of utilizing memory for the temporary or persistent storage of information, or a component thereof. For example, a host device of apparatus 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to apparatus 100; although in other embodiments, the host device may be indirectly connected to memory device (e.g., over a networked connection or through intermediary devices).

In some examples, the plurality of sense amplifiers 151 and the corresponding access circuits may include extended bit lines. The sense amplifiers 151 can include a coupling circuit (e.g., an equalizing transistor) across bit lines (e.g., DL and DLb) and corresponding sensing nodes. In comparison to some devices with bit lines that terminate (e.g., open-ended) before adjacent sense amplifier regions, the apparatus 100 can include the bit lines that extend across word lines and to adjacent sense amplifier locations. Opposite the coupling circuit, the bit lines can be connected to balancing circuits in the adjacent circuit locations. Details regarding the sense amplifiers 151 and the corresponding configurations are described below.

Figure 2A:
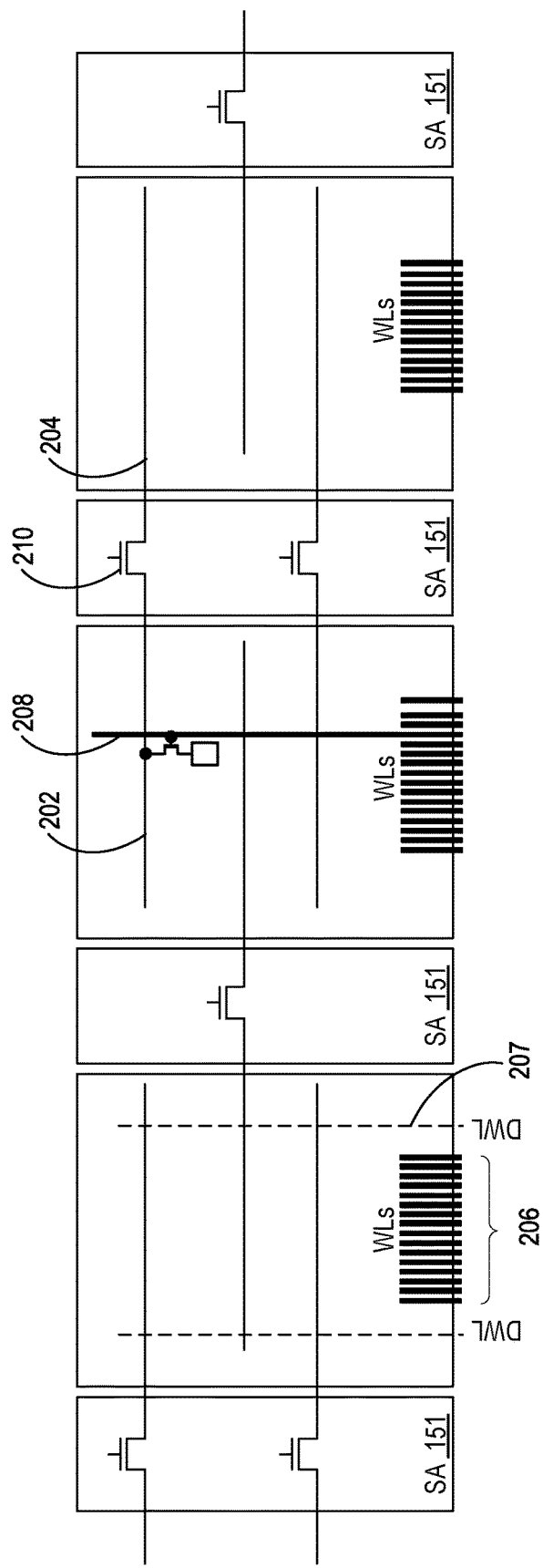
FIG. 2A is a schematic block diagram of example sense amplifier connections in accordance with an embodiment of the present technology.

FIG. 2A is a schematic block diagram of example sense amplifier connections in accordance with an embodiment of the present technology. In some embodiments, the sense amplifiers 151 can each include an equalization circuit 210. Each equalization circuit 210 can be configured to equalize the voltage levels of the connected digit lines (e.g., a first digit line 202 and a second digit line 204). The first digit line 202 and the second digit line 204 can be a pair of complementary digit/bit lines that can be selectively coupled to memory cells. For example, the digit lines can be coupled to memory cells via access devices (e.g., transistors) that are activated by signals communicated via word lines 206. To read information stored in a target memory cell (e.g., the level of the stored charges), the apparatus 100 can activate a target line 208 (e.g., an instance of the word lines 206) that corresponds to the target memory cells. Accordingly, the corresponding access device can connect the target memory cell to the digit line. The connected memory cell can influence a voltage level of the digit line, which can be read or determined by the sense amplifier.

The sense amplifiers 151 and sets of the word lines 206 can be arranged in an alternating configuration. In other words, a pair of sense amplifier circuit locations can surround a set of the word lines 206. Also, a pair of word line sets can surround a sense amplifier circuit location. Accordingly, the first digit line 202 and the second digit line 204 can extend away from the equalization circuit 210 and across the corresponding word line set. The first digit line 202 and the second digit line 204 can terminate before reaching the next sense amplifier circuit location. In some embodiments, the terminations of the first digit line 202 and the second digit line 204 can be open-ended (e.g., without any connections to other voltage potentials/devices).

Figure 2B:
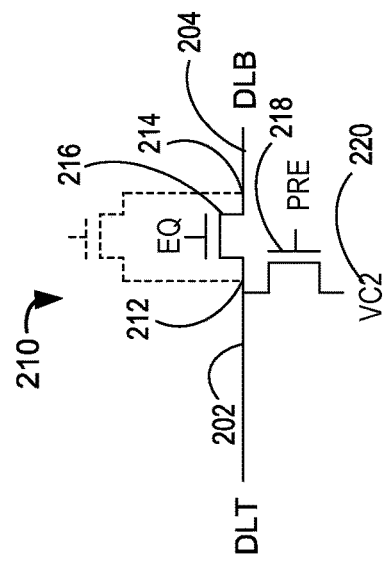
FIG. 2B is a circuit diagram of an example equalization circuit in accordance with an embodiment of the present technology.

FIG. 2B is a circuit diagram of an example equalization circuit 210 in accordance with an embodiment of the present technology. The equalization circuit 210 can include a first sensing node 212 and a second sensing node 214 (e.g., gut nodes) connected to the first digit line 202 and the second digit line 204, respectively. The equalization circuit 210 can include a coupling circuit 216 (e.g., a transistor device, such as an N-channel device) connected to the first sensing node 212 and the second sensing node 214 and operated by an equalization signal (EQ). The equalization circuit 210 can further include a precharging circuit 218 (e.g., a transistor device, such as an N-channel device) with one terminal connected to the first sensing node 212 and/or the second sensing node 214 and an opposite terminal connected to a precharging source 220. The precharging source 220 can correspond to a precharging voltage level that is between a high-level reading threshold and a low-level reading threshold used to identify fully charged state of connected memory cells. In some embodiments, the precharging voltage level can be half of the high-level reading threshold or less. Also, in some embodiments, the equalization circuit 210 can include a shorting device (shown in dashed lines) configured to electrically connect the first sensing node 212 and the second sensing node 214 separately/in addition to the coupling circuit 216.

In operating the equalization circuit 210 for reading the information stored in a memory cell, the first sensing node 212 and the second sensing node 214 can be electrically connected via the coupling circuit 216. In other words, the equalizing transistor can be activated to provide a connection/short between the gut nodes. Also, the first sensing node 212 and/or the second sensing node 214 can be precharged via the precharging circuit 218. In other words, the precharging transistor can be activated according to a precharging signal (PRE) to provide a connection between the gut nodes and the precharging source 220. During a first phase, the first sensing node 212 and the second sensing node 214 can be connected to each other and to the precharging source 220. Accordingly, voltage levels at the first sensing node 212 and the second sensing node 214 can correspond to the voltage level of the precharging source 220.

The equalization circuit 210 can be configured to precharge the gut nodes within a predetermined duration. Accordingly, physical lengths of the digit lines may be limited due to the associated propagation delay. In other words, physical lengths of the first digit line 202 and the second digit line 204 may be limited such that precharging times (tRP) meets the predetermined limits.

To complete the read, the memory cell can be connected to the digit lines after the first phase. Accordingly, the charges stored in the memory cells can affect the voltage levels at the first sensing node 212 and the second sensing node 214. Based on the amount of stored charges, the voltage at one of the gut nodes may increase, and the voltage at the other of the gut nodes may decrease. The increasing voltage may reach a level over the high-level reading threshold, and/or the decreasing voltage may reach a level below the low-level reading threshold. The sense amplifier 151 can read the information stored in the connected memory cell based on determining the resulting voltages on one or more of the digit lines and/or by comparing the resulting voltages to corresponding thresholds and/or to each other. At the end of the read, the voltages on the digit lines 202 and 204 may be complementary to each other.

Figure 2C:
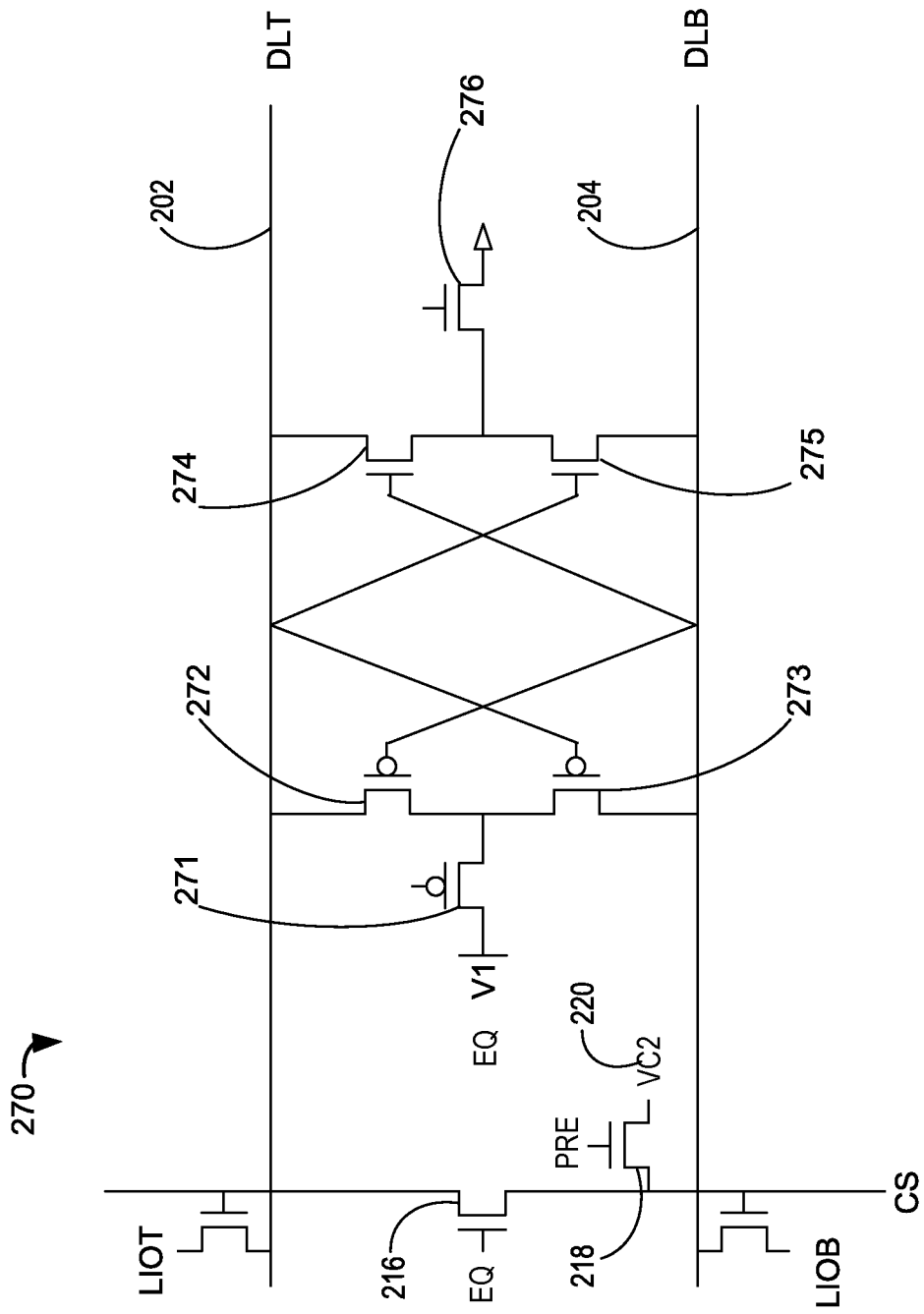
FIG. 2C is a circuit diagram of a first example sense amplifier in accordance with an embodiment of the present technology.

FIG. 2C is a circuit diagram of a first example of the sense amplifier 270 ("first sense amplifier 270") in accordance with an embodiment of the present technology. The first sense amplifier 270 can be an embodiment of the sense amplifier 151 of FIG. 2A.

The first sense amplifier 270 can be connected to the first and second digit lines 202 and 204 (DLT and DLB, respectively). The first and second digit lines 202 and 204 can be each be connected to switches (e.g., transistors LIOT and LIOB, respectively) that connect the digit lines to a memory cell according to a select signal (CS). The first sense amplifier 270 can include the coupling circuit 216 (EQ) connected between the first and second digit lines 202 and 204. When activated, the first sense amplifier 270 can be configured to electrically couple the first and second digit lines 202 and 204. The coupling circuit 216 can be further coupled to the precharging circuit 218. Accordingly, when activated, the precharging circuit 218 can be configured to electrically couple the first and/or the second digit lines 202 and 204 to the precharging source 220.

The first sense amplifier 270 can include a first and a second set of switches (e.g., PFET and/or NFET transistors) configured to determine the stored charges of the connected memory cell. The first set of switches may include a power switch 271 configured to connect a first voltage (V1) to a node between a pair of power delivery switches 272 and 273 that are connected between the first and second digit lines 202. For example, a terminal of a first power delivery switch 272 may be connected to the first digit line 202, and a terminal of a second power delivery switch 273 may be connect to the second digit line 204. Opposing terminals of the pair of power delivery switches 272 and 273 can be connected to the power switch 271. Control terminal (e.g., gate) of the first power delivery switch 272 may be connected to the second digit line 204, and control terminal of the second power delivery switch 273 may be connected to the first digit line 202.

The second set of switches can mirror the first set of switches and provide a path to a second voltage potential (e.g., an electrical ground). For example, the second set of switches can include a grounding switch 276 configured to connect a node between a pair of ground connection switches 274 and 275 to electrical ground. A terminal of a first ground connection switch 274 may be connected to the first digit line 202, and a terminal of second ground connection switch 275 may be connected to the second digit line 204. Opposing terminals of the pair of ground connection switches 274 and 275 can be connected to the grounding switch 276. Control terminal (e.g., gate) of the first ground connection switch 275 may be connected to the second digit line 204, and control terminal of the second ground connection switch 275 may be connected to the first digit line 202.

The equalization circuit 210 can be integrated into and/or separately attached to the first sense amplifier 270. In some embodiments, the first set of transistors may be complementary to the second set of transistors. For example, the first set of transistors may include p-type transistors and the second set of transistors may include n-type transistors.

Figure 2D:
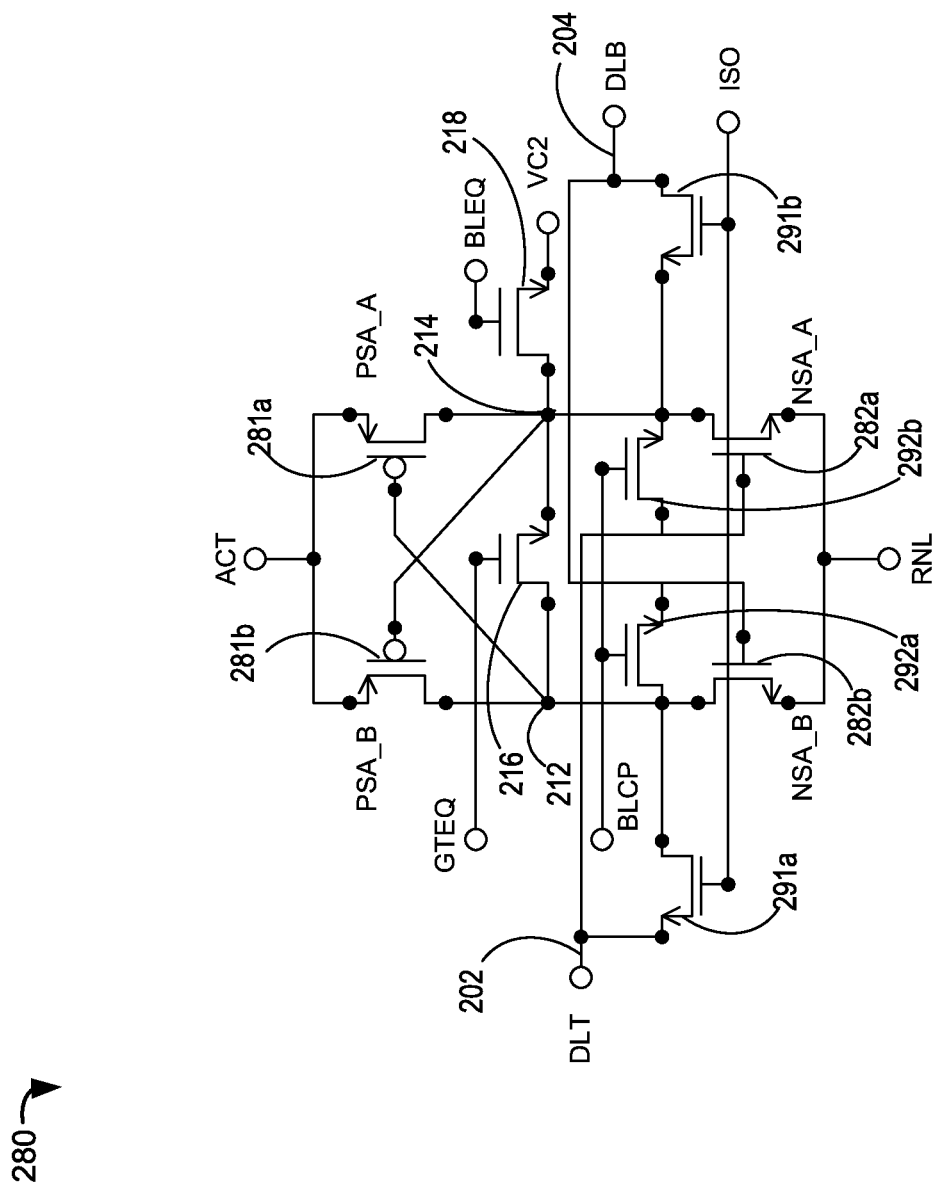
FIG. 2D is a circuit diagram of a second example sense amplifier in accordance with an embodiment of the present technology.

FIG. 2D is a circuit diagram of a second example of the sense amplifier 280 ("second sense amplifier 280") in accordance with an embodiment of the present technology. The second sense amplifier 280 can be an embodiment of the sense amplifier 151 of FIG. 2A. The second sense amplifier 280 can include a voltage-threshold compensation (VtC) sense amplifier configured to mitigate the voltage-threshold (Vt) mismatch that may be introduced due to process mismatch.

For example, the second sense amplifier 280 can include a first set of transistors (e.g., p-type field effect transistors (PFETs)) 281a and 281b, each having a terminal (e.g., drains) coupled to the first sensing node 212 and the second sensing node 214, respectively. The second sense amplifier 280 can further include a second set of transistors (e.g., n-type field effect transistors (NFETs)) 282a and 282b, each having a terminal (e.g., drains) coupled to the first sensing node 212 and the second sensing node 214, respectively. In one or more embodiments, the first sensing node 212 and the second sensing node 214 may be called "gut nodes" in a non-limiting manner. Second terminals (e.g., respective gates) of the transistors 281a and 281b can be coupled to the second sensing node 214 and the first sensing node 212, respectively. Third terminals (e.g., sources) of the transistors 281a and 281b can be coupled to a first power supply node ACT, and third terminals (e.g., sources) of the transistors 282a and 282b can be coupled to a second power supply node RNL. The first terminals (e.g., the drains) of transistors 282a and 282b can be coupled to the first sensing node 212 and the second sensing node 214, respectively.

The second sense amplifier 280 can include a first set of transistors (e.g., NFETs) 291a and 291b and a second set of transistors (e.g., NFETs) 292a and 292b that are coupled to the first sensing node 212 and the second sensing node 214. In one or more embodiments, the first and second sets of transistors 291a-292b can be cross coupled. For example, first terminals (e.g., drains) of the transistors 291a and 292a can be coupled to the first sensing node 212. Second terminals (e.g., sources) of the transistors 291b and 292b can be coupled to the second sensing node 214. One or more of the terminals for the first set of sense transistors 291a and 291b and the second set of sense transistors 292a and 292b can be coupled to the first sensing node 212 and the second sensing node 214. For example, a second terminal (e.g., a source) of the transistor 291a can be coupled to the first sensing node 212, and a first terminal (e.g., a drain) of the transistor 291b can be coupled to the second sensing node 214. Third terminals (e.g., gates) of the transistors 291a and 291b can be coupled to a control signal ISO that changes active/inactive states thereof. Also, a second terminal (a source) of the transistor 292a, along with a terminal (e.g., a gate) of the transistor 282a can be coupled to the second sensing node 214. A first terminal (a drain) of the transistor 292b, along with a terminal (e.g., a gate) of the transistor 282b can be coupled to the first sensing node 212. Third terminals (e.g., gates) of the transistors 292a and 292b can be connected to a control signal BLCP that changes active/inactive states thereof. Further, the first digit line 202 (DLT) can be coupled to the first sensing node 212 and the second digit line 204 (DLB) can be coupled to the second sensing node 214. Accordingly, the second sense amplifier 280 can be configured for sampling the Vt at a set of terminals (e.g., the drains) of the first and second sets of transistors 291a-292b that correspond to the first and second digit lines 202 and 204.

In some embodiments, the second sense amplifier 280 can include the coupling circuit 216 (e.g., an NFET) having a first terminal (e.g., a drain) and a second terminal (e.g., a source) coupled to the first sensing node 212 and the second sensing node 214, respectively. The second sense amplifier 280 can further include the precharging circuit 218 (e.g., an NFET) coupled to the second sensing node 214. The precharging circuit 218 can have a first terminal (e.g., a drain) coupled to the first sensing node 212 and/or the second sensing node 214. The precharging circuit 218 can be configured to provide a voltage VC2 from a second terminal (e.g., a source) to the connected nodes (e.g., the first sensing node 212 and/or the second sensing node 214) when activated by an active control signal BLEQ (e.g., high logic level). In some embodiments, the voltage VC2 can be provided to the second sensing node 214 when the precharging circuit 218 is active. When activated by an active control signal GTEQ (e.g., high logic level), the coupling circuit 216 can provide a conductive path between the first sensing node 212 and the second sensing node 214, thereby equalizing the respective node voltages.

For illustrative purposes, the transistors 281a and 281b are shown as PFETs and the transistors 282a, 282b, 216, 218, 291a, 291b, 292a, and 292b are shown as NFETs in FIG. 2D. However, it is understood that one or more of the transistors can be a different type, connected to a different transistor, and/or connected to a different circuit without departing from the scope of the disclosure. Also, it is understood that the second sense amplifier 280 can include other configurations that mitigate the Vt mismatch.

Figure 3A:
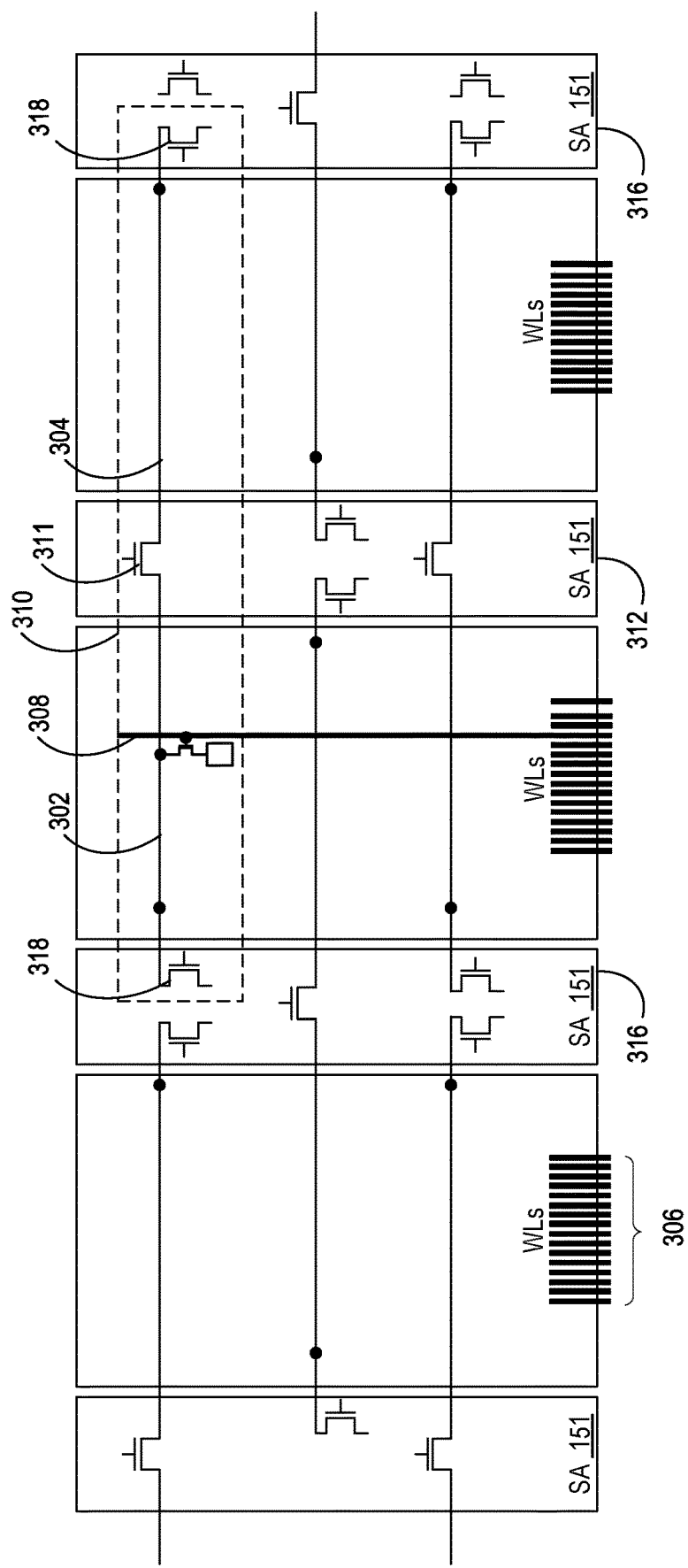
FIG. 3A is a schematic block diagram of example sense amplifier connections with extended digit lines in accordance with an embodiment of the present technology.
Figure 3B:
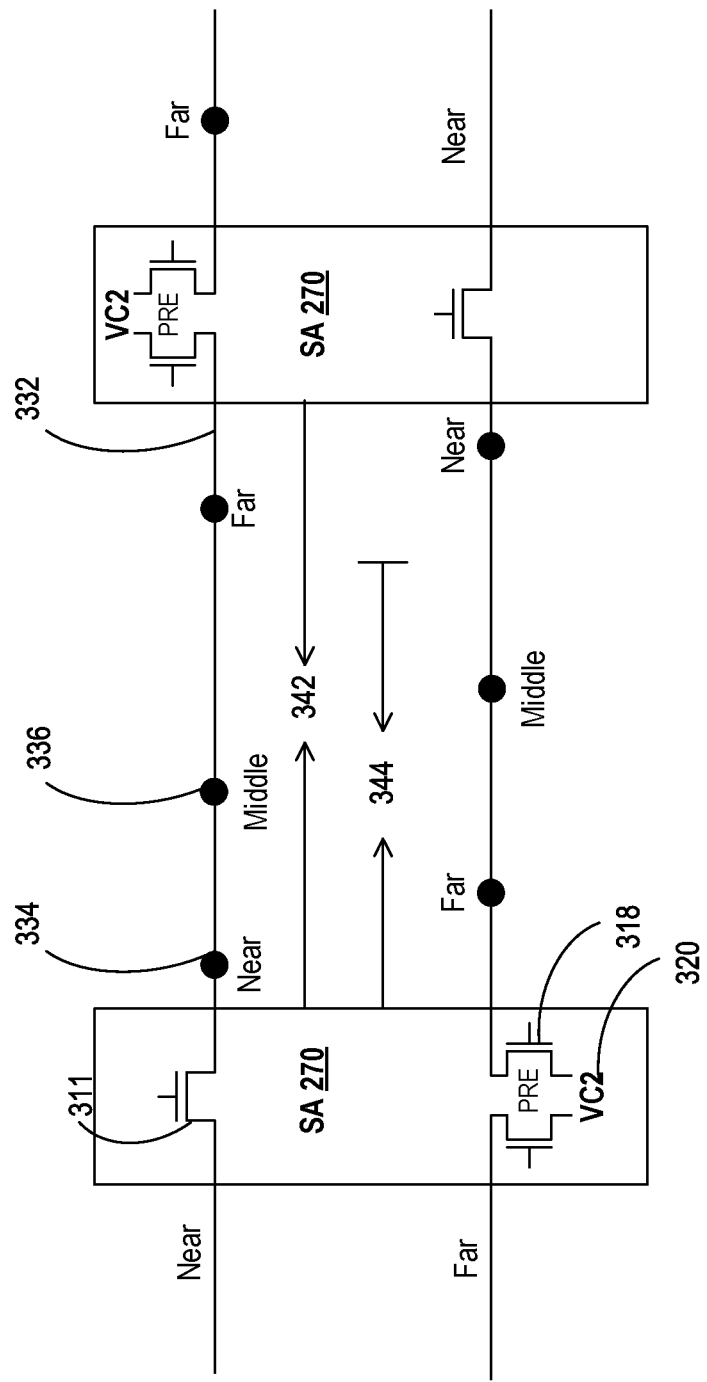
FIG. 3B is a detailed block diagram of the example sense amplifier connections of FIG. 3 in accordance with an embodiment of the present technology.
Figure 3C:
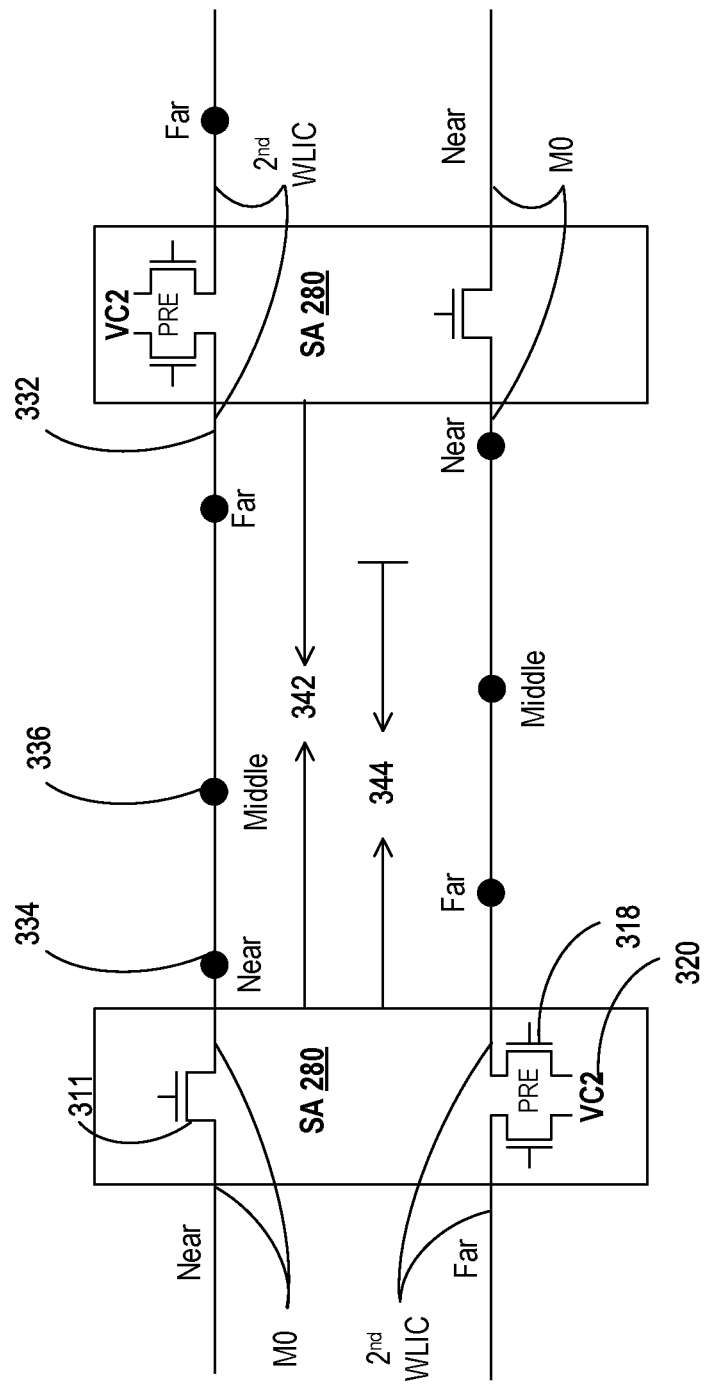
FIG. 3C is a detailed block diagram of the example sense amplifier connections of FIG. 3 in accordance with an embodiment of the present technology.

FIG. 3A is a schematic block diagram of example sense amplifier connections with extended digit lines and FIGS. 3B and 3C are detailed block diagrams of the example sense amplifier connections of FIG. 3, all in accordance with an embodiment of the present technology. Referring to FIGS. 3A, 3B, and 3C together, the sense amplifiers 151 may each include one or more sensing circuits 310. Each sensing circuit 310 can be configured to determine information/value for one connected memory cell. The sensing circuit 310 may include a coupling circuit 311 (e.g., a transistor device, such as an N-channel device, such as an NCHEQA device) similar to the coupling circuit 216 of FIG. 2B and configured to connect sensing nodes of the sensing circuit 310.

Each of the sensing circuits 310 can be connected to a first extended digit line 302 and a second extended digit line 304. The first digit line 302 and the second digit line 304 can be a pair of complementary digit/bit lines that can be selectively coupled to memory cells. Some aspects of the extended digit lines 302 and 304 may be similar to the digit lines 202 and 204 of FIG. 2A. For example, the digit lines can be coupled to memory cells via access devices (e.g., transistors) that are activated by signals communicated via word lines 306. To read information stored in a target memory cell (e.g., the level of the stored charges), the apparatus 100 can activate a target line 308 (e.g., an instance of the word lines 306) that corresponds to the target memory cells. Accordingly, the corresponding access device can connect the target memory cell to the digit line. The connected memory cell can influence a voltage level of the digit line, which can be read or determined by the sense amplifier.

The sense amplifiers 151 and sets of the word lines 306 can be arranged in an alternating configuration. Also, a pair of word line sets can surround a sense amplifier circuit location. For example, one instance of the sensing circuit 310 can be located within a targeted sensing region 312. The targeted sensing region 312 can include the gut nodes and/or other circuitry for the corresponding sense amplifier and can be located between adjacent sets of word lines as illustrated in FIG. 3A. Adjacent circuit regions 316 may be located opposite the adjacent sets of word lines from the targeted sensing region 312.

The extended digit lines 302 and 304 can extend away from the sensing circuit 310 and across the adjacent word line sets. The extended digit lines 302 and 304 may extend into the adjacent circuit regions 316. In some embodiments, the extended digit lines 302 and 304 may be longer than digit lines 202 and 204. The extended digit lines 302 and/or 304 can have extended line lengths 342 longer than a single-end length limit 344 that corresponds to a length of digit lines that are not connected to termination devices and/or a length that enable precharging within the precharging time threshold. The extended digit lines 302 and 304 can each be terminated by a balancing circuit 318 (e.g., a transistor device, such as an N-channel device) configured to selectively connect an extended-line portion 332 of the corresponding extended digit line to a precharging source 320. For example, the balancing circuit 318 can include an NCHEQA device. The balancing circuit 318 may be similar to the precharging circuit 218 of FIG. 2B and the precharging source 320 can be similar to the precharging source 220 of FIG. 2B. In some embodiments, components and/or configurations within the balancing circuit 318 can match those of the coupling circuit 311. Also, the balancing circuit 318 may be removed from direct connections to any word lines and/or any dummy lines.

To read the information stored in a memory cell, first and second sensing nodes in the sensing circuit 310 can be electrically connected. For example, the EQ signal can activate the coupling circuit 311, thereby electrically connecting the nodes that correspond to the first extended digit line 302 and the second extended digit line 304. Also, the sensing circuit 310 can activate the balancing circuits 318 connected to the extended digit lines 302 and 304 opposite the coupling circuit 311. For example, the PRE or the EQ signal can activate the balancing circuit 318 and electrically connect the extended line-portions 332 of the extended digit lines 302 and 304 to the precharging source 320. In other words, the sensing circuit 310 can precharge the extended digit lines 302 and 304 from both/opposing ends. When the extended digit lines 302 and 304 are complementary and have complementary voltage levels at the end of a preceding read operations, connecting the sensing nodes can precharge the extended digit lines 302 and 304 to a voltage level between a high and a low level. Also, the sensing circuit 310 can precharge the extended line-portions 332 using the balancing circuit 318. The opposing ends of each of the extended digit lines 302 and 304 may be precharged simultaneously (via, e.g., simultaneous control of the EQ and PRE signals). Even when the mid-point between the initial voltage levels of the extended digit lines 302 and 304 are different from the precharging source 320, the differences may be within precharging tolerance levels and/or may be adjusted within the precharging time limit via the connection to the precharging source 320.

Accordingly, the coupling circuit 311 and the balancing circuits 318 can each correspond to precharging a portion (e.g., half) of the corresponding digit line, thereby reducing the propagation delay associated with the precharging operation. Thus, the extended digit lines 302 and 304 may be lengthened without violating the precharging time requirements. The extended digit lines 302 and 304 may provide flexibility in aligning with production yield increases, increased circuit/memory cell density or size associated with sense amplifiers, and/or flexibility in circuit layouts. Further, the balancing circuits 318 can enable longer digit lines without changing pitch sizes thereof.

In some embodiments, the extended line-portion 332 may include conductors or connections in a separate wiring layer than near line-portion 334 and/or middle line-portion 336 of the corresponding extended digit line. In one or more embodiments, the extended line-portion 332, the near line-portion 334, and/or the middle line-portion 336 may include conductors in one or more Tungsten layers and/or an M0 routing layer. For example, the extended line-portion 332, the near line-portion 334, and/or the middle line-portion 336 can include Tungsten. In some embodiments, the balancing circuits 318 can replace equalizing transistors (e.g., GTEQ devices) and/or be placed at the edge of sense amplifier circuits in layout for the first sense amplifier 270. The balancing circuits 318 can be connected to the far side (e.g., the extended line-portion 332) by Tungsten, which can keep the pitch size of the conductor constant.

In one or more embodiments, as illustrated in FIG. 3C, the sense amplifiers 151 may include the second sense amplifier 280 of FIG. 2D (e.g., a VtC sense amplifier). The second sense amplifiers 280 may include Tungsten layer connections that connect the digit lines (e.g., the first digit line 302 and/or the second digit line 304) to the gut nodes. The second sense amplifier 280 sense amplifiers and the digit lines can be connected via conductors on multiple layers. For example, the second sense amplifier 280 can include more components and corresponding connections than other sense amplifiers, such as the first sense amplifier 270 of FIG. 2C. As such, the internal connections (e.g., the middle line-portion 336 implemented on the Tungsten layer) may be more crowded and more complex than the other sense amplifiers. Thus, the near line-portion 334 and the extended line-portion 332 may correspond to a separate wiring layers, such as M0 and a second WLIC. The conductor on M0 layer, the Tungsten layer, and/or the second WLIC layer may include double DL pitch.

Figure 4:
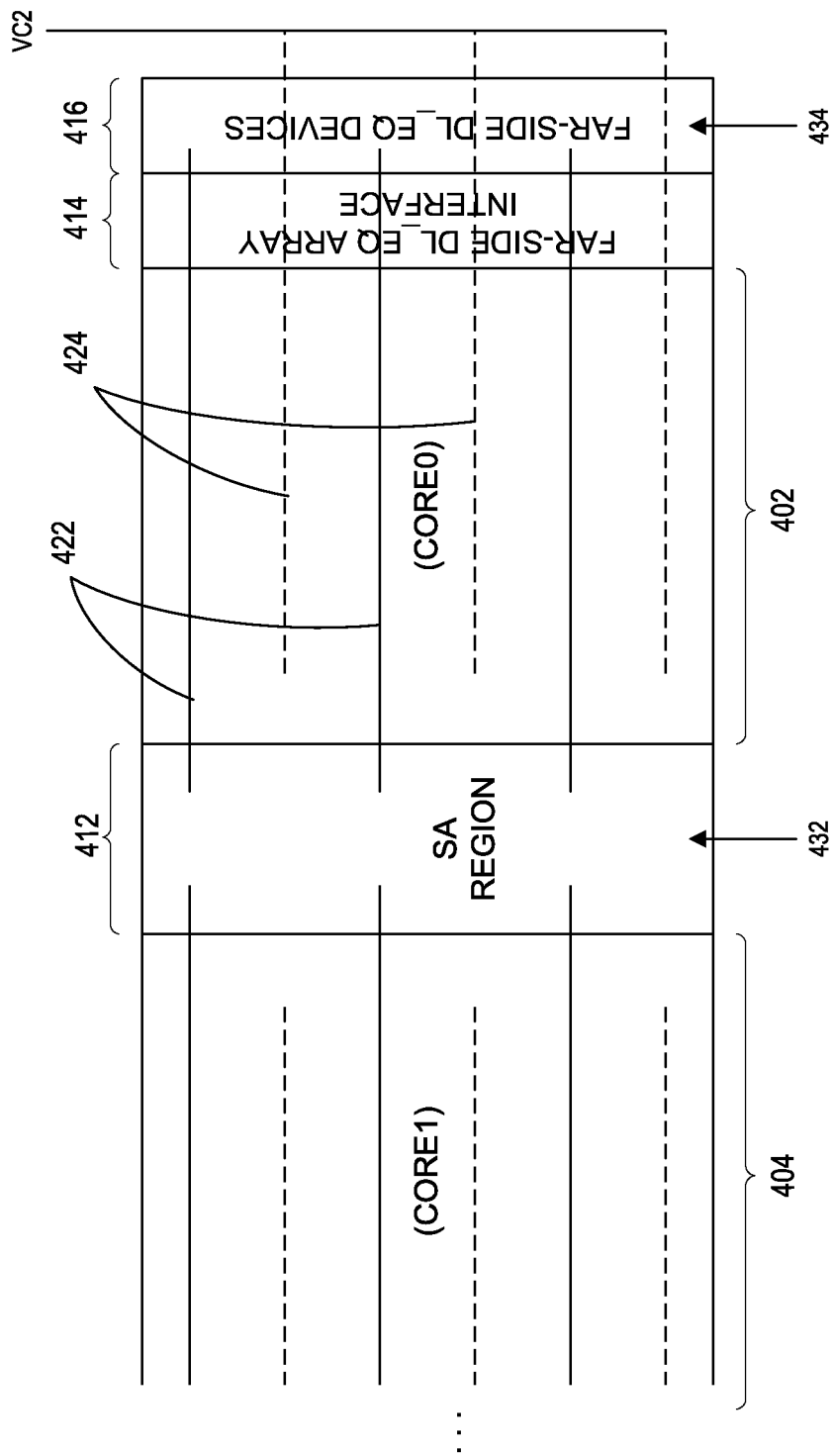
FIG. 4 is an example illustration of an end portion of an array in accordance with an embodiment of the present technology.

FIG. 4 is an example illustration of an end portion 400 of an array (e.g., the memory array 150 of FIG. 1) in accordance with an embodiment of the present technology. The end portion 400 can include an edge memory region 402 located at a peripheral portion of the array. An internal memory region 404 may be opposite the edge memory region 402 across an edge active region 412. The edge memory region 402 and the internal memory region 404 can each include a unique set of memory cells configured to store information as described above. The edge active region 412 can include active circuitry, such as the sense amplifiers 151 (e.g., the first sense amplifiers 270 of FIG. 2C and/or the second sense amplifiers 280 of FIG. 2D).

In some embodiments, the edge memory region 402 and the internal memory region 404 can include digit lines, such as middle line-portions 336 of FIG. 3B that extend between adjacent active regions. In conventional devices, the digit lines of the edge memory region 402 would typically be unterminated at the edge. A set of active digit lines 422 may be connected to sense amplifiers in the edge active region 412. A set of digit lines (e.g., an alternating set of connections) would be unconnected to sense amplifiers in the edge active region 412 and remain as dummy digit lines 424. In other words, the dummy digit lines 424 can correspond to digit lines that would have been connected to sense amplifiers on the right side of the region if not for the edge location/configuration.

In contrast to the conventional devices, one or more embodiments of the present technology can include termination circuits for the digit lines extending across the edge memory region 402. For example, the end portion 400 can include an interface region 414 that connects the edge memory region 402 to a termination region 416 (e.g., a separate active region) that includes the balancing circuit 318 of FIG. 3A. The interface region 414 can include connections (e.g., traces or conductors) that extend the digit lines (e.g., the active digit lines 422) beyond the edge (i.e., the edge opposite the edge active region 412) of the edge memory region 402. Accordingly, the interface region 414 can correspond to the extended line-portion 332 of FIG. 3B or FIG. 3C and/or electrically couple the active digit lines 412 to the balancing circuits 318. Thus, the interface region 414, the termination region 416, and the components therein can complete the circuitry described above and ensure that the active digit lines 412 are extended digit lines.

The balancing circuits 318 (including those in the termination region 416) may be controlled by a signal (e.g., a second control signal 434) that is the same as or different from a signal (e.g., a first control signal 432) controlling the coupling circuit 311 of FIG. 3A. For example, when the memory device 200 includes the first sense amplifier 270, the balancing circuits 318 and the coupling circuit 311 may be activated simultaneously. Also, when the memory device 200 includes the second sense amplifier 280, the balancing circuits 318 and the coupling circuit 311 may be activated at different times.

In some embodiments, the dummy digit lines 424 can be connected to a voltage potential. For example, the dummy digit lines 424 may be directly connected (e.g., without any switching devices) to the precharging source 320 of FIG. 3B (VC2). By connecting the dummy digit lines 424 to the precharging source 320, the memory device 200 can reduce noise and cross-talk caused by the dummy digit lines 424 and reduce error rates.

Figure 5A:
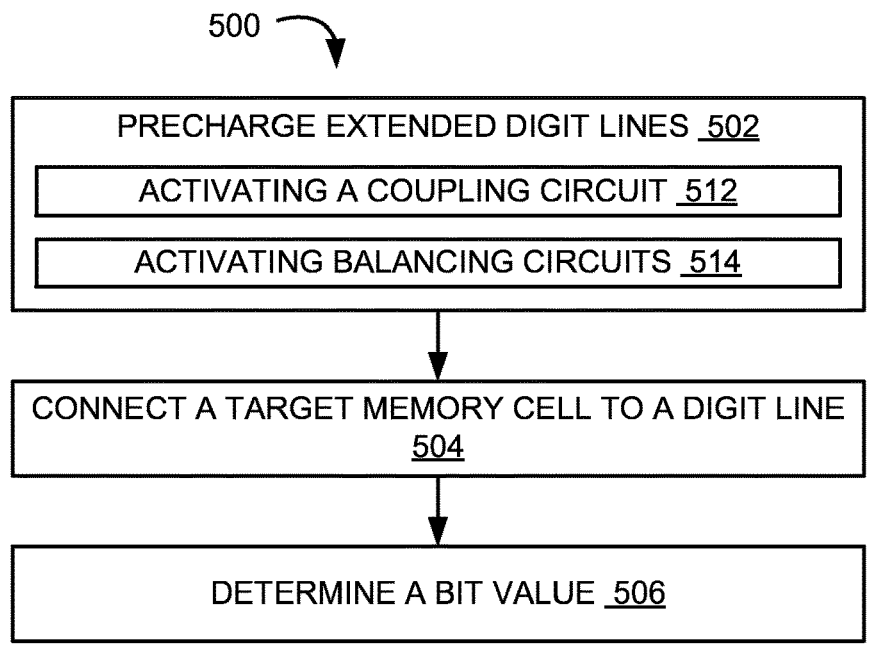
FIG. 5A is a flow diagram illustrating an example method of operating an apparatus in accordance with an embodiment of the present technology.

FIG. 5A is a flow diagram illustrating an example method 500 of operating an apparatus (e.g., the apparatus 100 of FIG. 1 and/or the sense amplifiers 151 of FIG. 1 therein) in accordance with an embodiment of the present technology. For example, the method 500 can be for operating the sense amplifier 151 and/or the components therein, such as the sensing circuit 310, the coupling circuit 311, the balancing circuits 318, and/or other components illustrated in FIGS. 3A and 3B. The method 500 can be for precharging the extended digit lines (e.g., the first and second digit lines 302 and 304 of FIG. 3A) from opposing ends in determining bit values represented by charge levels stored in the memory cells.

At block 502, the apparatus 100 (e.g., the sense amplifier 151) can precharge the extended digit lines for determining a bit value represented by an amount of charges stored in a target memory cell. The apparatus 100 can precharge the extended digit lines by controlling voltages at opposing end points of each of the extended digit lines. At block 512, the apparatus 100 can precharge by activating the coupling circuit 311 of FIG. 3A to connect the first extended digit line 302 of FIG. 3A and the second extended digit line 304 of FIG. 3A. Accordingly, the apparatus 100 can equalize the complementary voltage levels on the first and second extended digit lines 302 and 304. At block 514, the apparatus 100 can precharge by activating the balancing circuits 318 of FIG. 3A. Accordingly, the balancing circuits 318 can connect end points of the extended digit lines 302 and 304 that are opposite the coupling circuit 311 to the precharging source 320 of FIG. 3B to precharge the extended digit lines.

The apparatus 100 may control the voltages at the opposing end points concurrently or substantially at the same time. In some embodiments, the apparatus 100 may be configured to control the coupling circuit 330 and the balancing circuits 318 using the same signal (e.g., the PRE signal or the EQ signal). Accordingly, the apparatus 100 may concurrently activate the coupling circuit 330 and the balancing circuits 318 by controlling the common control signal.

At block 504, the apparatus 100 can connect a target memory cell to a precharged digit line. In other words, the apparatus 100 can connect the target memory cell to one of the extended digit line after precharging the extended digit lines. The apparatus 100 may control/communicate a signal via the target line 308 of FIG. 3A to control a corresponding access device. Accordingly, the access device can connect the corresponding target memory cell to one of the first and second extended digit lines 302 and 304. The amount of stored charges in the connected target memory cell can affect the voltage levels of the first and second extended digit lines 302 and 304. In some embodiments, the sensing circuit 310 of FIG. 3A can be configured to provide complementary voltage levels on the first and second extended digit lines 302 and 304. Accordingly, the connected target memory cell can affect one of the digit lines, and the sensing circuit 310 can control the voltage levels of the other of the digit lines according to the voltage on the connected digit line.

At block 506, the apparatus 100 can determine a bit value represented by an amount of charges stored in the memory cell. The sensing circuit 310 and/or other connected circuits can determine the bit value (e.g., stored information) according to the updated voltage levels of the first and second extended digit lines 302 and 304. For example, the sensing circuit 310 can determine the bit value based on determining which of the first and second extended digit lines 302 and 304 have a voltage level above a threshold level. The determined bit value can correspond to a result of reading the information stored in the targeted memory cell.

Figure 5B:
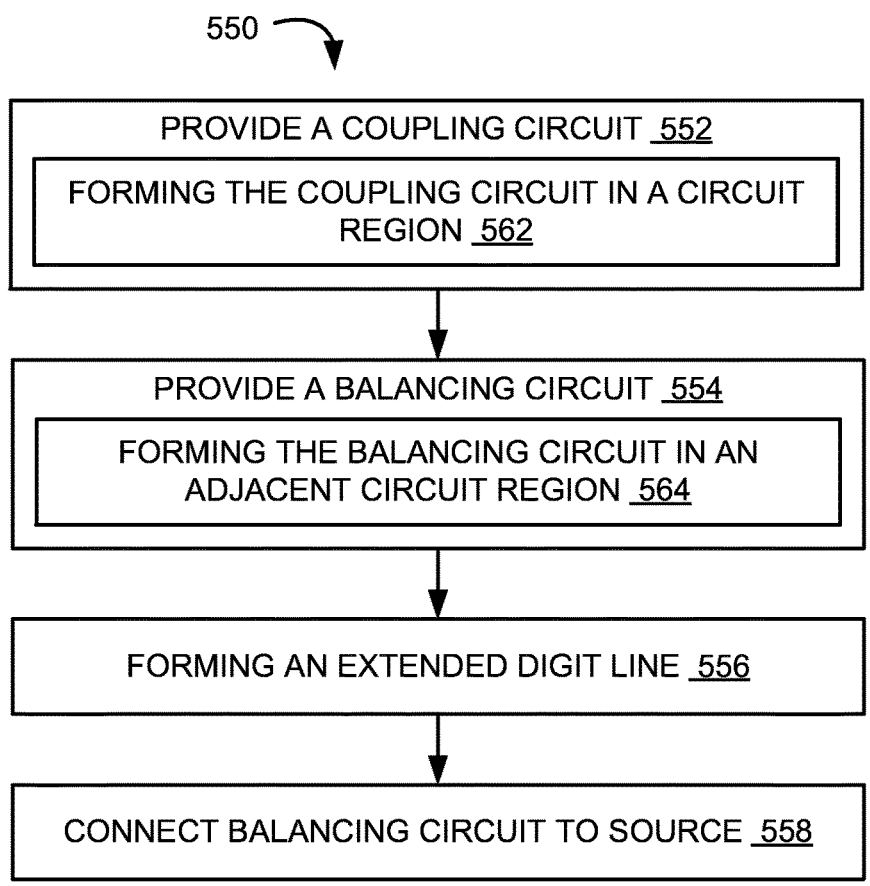
FIG. 5B is a flow diagram illustrating an example method of manufacturing an apparatus in accordance with an embodiment of the present technology.

FIG. 5B is a flow diagram illustrating an example method 550 of manufacturing an apparatus (e.g., the apparatus 100 of FIG. 1, the sense amplifiers 151 of FIG. 1, and/or a portion therein) in accordance with an embodiment of the present technology. For example, the method 550 can be for manufacturing the extended digit lines and/or corresponding circuits for the sense amplifiers 151.

At block 552, the method 550 can include providing a coupling circuit (e.g., the coupling circuit 311 of FIG. 3A). For example, one or more transistors (e.g., N-channel devices) can be provided for forming the sensing circuit 310 of FIG. 3 and/or the sense amplifiers 151. The transistor may be provided at designated circuit regions. In some embodiments, providing the coupling circuit may include forming the coupling circuit 311 in the designated circuit regions as illustrated at block 562. For example, the coupling circuit 311 may be formed by depositing doping agents, depositing/etching resists and/or metals, and/or other semiconductor manufacturing processes.

At block 554, the method 550 can include providing a balancing circuit (e.g., the balancing circuit 318 of FIG. 3A). For example, a one or more transistors (e.g., N-channel devices) can be for forming the sensing circuit 310 and/or the sense amplifiers 151. The transistor may be provided at designated circuit regions. The balancing circuit 318 can be provided in circuit regions adjacent to the circuit region of the corresponding coupling circuit 311. In some embodiments, providing the balancing circuit may include forming the balancing circuit 318 in an adjacent circuit region (e.g., adjacent to the circuit region having the corresponding coupling circuit 311) as illustrate at block 564. The balancing circuit 318 can be formed similarly as the coupling circuit 311, such as according to one or more semiconductor manufacturing processes.

At block 556, the method 550 can include forming an extended digit line (e.g., the first extended digit line 302 and/or the second extended digit line 304). The method 550 can form the extended digit line connecting the coupling circuit 311 and the corresponding balancing circuit 318. For example, the extended digit lines 302 and 304 can be formed connected to opposing terminals of the coupling circuit 311. The extended digit lines 302 and 304 can be formed extending across sets of word lines that are located between adjacent circuit regions. The ends of the extended digit lines 302 and 304 opposite the coupling circuit 311 can be connected to the corresponding balancing circuits 318 located in the adjacent circuit regions.

In some embodiments, forming the extended digit lines can include forming one or more connected sections of Tungsten conductors on one or more circuit/conductor layers. For each extended digit line, the sections of the Tungsten conductors may be connected to each other and to the coupling transistor and the balancing transistor. In some embodiments, forming the extended digit lines can include forming a near portion (e.g., the near portion 334 of FIG. 3B), a middle portion (e.g., the middle portion 336 of FIG. 3B), and/or an extended portion (e.g., the extended portion 332 of FIG. 3B). The near portion may be formed directly connected to the coupling circuit 311, the extended portion may be formed directly connected to the balancing circuit 318, and the middle portion may be formed connecting the near and extended portions. The near portion may include a first conductor in an M0 layer, the middle portion may include a Tungsten conductor, and/or the extended portion may include a conductor in a layer different from the M0 layer and the Tungsten layer.

In one or more embodiments, a space may be opened according to predetermined dimensions between the balancing circuit 318 (BLEQ device) and extended line-portion 332. The space may correspond to additional connectors and/or double DL pitch. The extended line-portions 332 can surround a set (e.g., a pair) of the balancing circuit 318 that are located in the opened space. The balancing circuits 318 can each be connected to a corresponding extended line-portion 332 that includes, for example, through through-silicon vias that traverse across layers, 2WLIC layer conductors, and/or Tungsten connectors. The balancing circuits 318 can be configured to short the extended line-portions 332 to VC2 voltage potential. On the near-side, the digit lines can surround the coupling circuit 311 configured to short the surrounding pair of near line-portions 334 together. The coupling circuit 311 can be connected to the near line-portions 334 that includes, for example, through through-silicon vias that traverse across layers, M0 layer conductors, and/or Tungsten connectors.

At block 558, the method 550 can include connecting the balancing circuit to a voltage source (e.g., the precharging source 320 of FIG. 3B). A terminal of the balancing circuit 318 that is opposite the extended digit line may be connected to the precharging source 320. Accordingly, the balancing circuit 318 can be configured to selectively connect the extended digit line to the precharging source 320 to precharge the extended digit line. Similarly, the coupling circuit 311 can be configured to precharge the extended digit line from the opposing end. In some embodiments, the coupling circuit 311 and the balancing circuit 318 can be configured to activate concurrently, such as by being connected to a common control signal and/or a timing mechanism.

Figure 6:
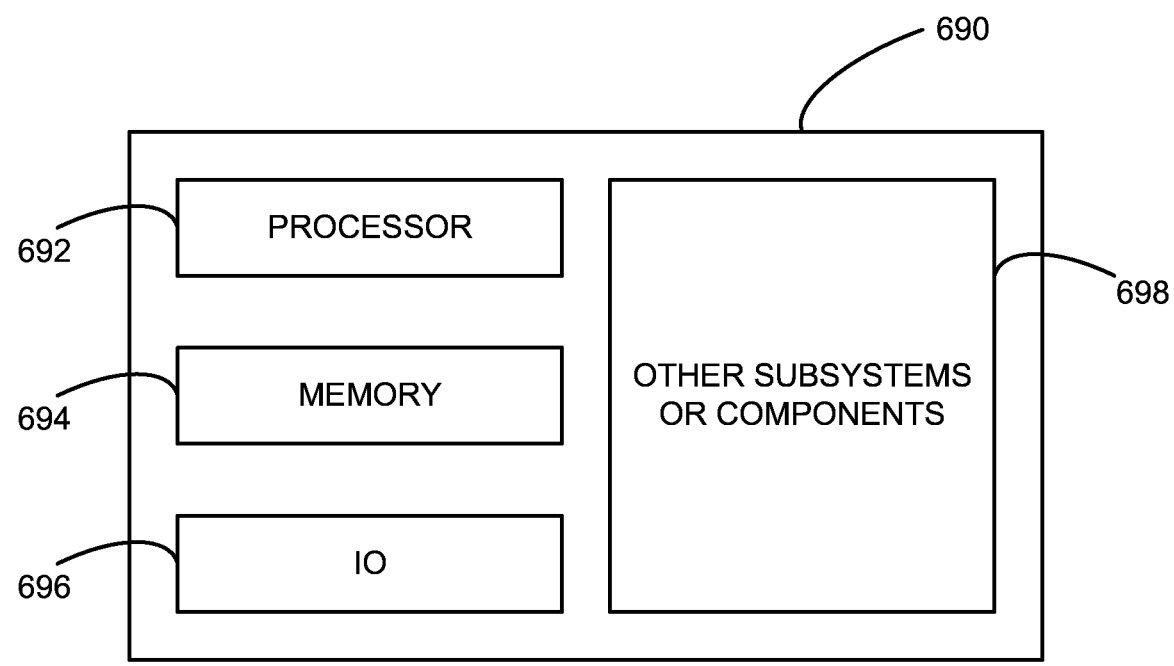
FIG. 6 is a schematic view of a system that includes an apparatus in accordance with an embodiment of the present technology.

FIG. 6 is a schematic view of a system that includes an apparatus in accordance with embodiments of the present technology. Any one of the foregoing apparatuses (e.g., memory devices) described above with reference to FIGS. 1-5B can be incorporated into any of a myriad of larger and/or more complex systems, a representative example of which is system 680 shown schematically in FIG. 6. The system 680 can include a memory device 600, a power source 682, a driver 684, a processor 686, and/or other subsystems or components 688. The memory device 600 can include features generally similar to those of the apparatus described above with reference to FIGS. 1-5B, and can therefore include various features for performing a direct read request from a host device. The resulting system 680 can perform any of a wide variety of functions, such as memory storage, data processing, and/or other suitable functions. Accordingly, representative systems 680 can include, without limitation, hand-held devices (e.g., mobile phones, tablets, digital readers, and digital audio players), computers, vehicles, appliances and other products. Components of the system 680 may be housed in a single unit or distributed over multiple, interconnected units (e.g., through a communications network). The components of the system 680 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structure includes information arranged as bits, words or code-words, blocks, files, input data, system-generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-6.

What is claimed is:

1. An apparatus, comprising:
   an extended digit line configured to selectively connect to a memory cell storing an amount of charges representative of a bit value, wherein the extended digit line has a length longer than a limit length representative of open-ended digit lines; and
   a sense amplifier connected to the extended digit line and configured to determine the bit value stored in the memory cell, wherein the sense amplifier includes
      a coupling circuit connected to the extended digit line, and
      a balancing circuit connected to the extended digit line opposite the coupling circuit and configured to selectively connect the extended digit line to a precharging source and,
      wherein the coupling circuit and the balancing circuit are configured to precharge the extended digit line for determining the stored bit value.

2. The apparatus of claim 1, further comprising:
   a second extended digit line connected to the coupling circuit;
   a second balancing circuit connected to the second extended digit line opposite the coupling circuit and configured to precharge the second extended digit line;
   wherein:
   the extended digit line is a first extended digit line; and
   the balancing circuit is a first balancing circuit.

3. The apparatus of claim 2, wherein the first and second extended digit lines are complementary.

4. The apparatus of claim 3, wherein the coupling circuit is a transistor device configured to activate and connect the first and second extended digit lines to precharge the first and second extended digit lines.

5. The apparatus of claim 1, wherein the coupling circuit and the balancing circuit are configured to precharge the extended digit line from opposing ends thereof.

6. The apparatus of claim 1, wherein the coupling circuit and the balancing circuit are configured to activate simultaneously and precharge the extended digit line from the opposing ends.

7. The apparatus of claim 1, wherein the extended digit line is not connected to a dummy word line.

8. The apparatus of claim 1, wherein the balancing circuit is not directly connected to a word line.

9. The apparatus of claim 1, wherein:
   the coupling circuit is located at a targeted sensing region within the apparatus;
   the balancing circuit is located at an adjacent circuit region separate from the target sensing region; and
   the extended digit line extends between the targeted sensing region and the adjacent circuit region.

10. The apparatus of claim 9, further comprising a set of word lines located between the targeted sensing region and the adjacent circuit region, the set of word lines configured to communicate activation signals that control access devices for selectively connecting memory cells to the extended digit line, wherein the activation signals are configured to connect the memory cells after precharging the extended digit line to determine the stored bit value.

11. The apparatus of claim 9, wherein:
    the sense amplifier comprises a first sense amplifier;
    further comprising
    a second sense amplifier in the adjacent circuit region and independent of the balancing circuit.

12. The apparatus of claim 1, wherein the extended digit line includes:
    a near portion directly connected to the coupling circuit, wherein the near portion includes a first conductor in an M0 layer;
    a middle portion connected to the near portion opposite the coupling circuit, wherein the middle portion includes Tungsten; and
    an extended portion with one end directly connected to the middle portion and an opposite end directly connected to the balancing circuit, wherein the extended portion includes a second conductor in a layer different from the M0 layer and the Tungsten.

13. The apparatus of claim 12, wherein the sense amplifier is a voltage-threshold compensation (VtC) sense amplifier configured to mitigate a voltage-threshold mismatch.

14. The apparatus of claim 1, wherein the extended digit line includes:
   a near portion directly connected to the coupling circuit;
   a middle portion connected to the near portion opposite the coupling circuit; and
   an extended portion with one end directly connected to the middle portion and an opposite end directly connected to the balancing circuit, wherein the near portion, the middle portion, and the extended portion include Tungsten.

15. The apparatus of claim 1, wherein:
   the extended digit line extends across an edge memory region and to a physical edge of an array;
   the coupling circuit is located between the edge memory region and an internal memory region; and
   the balancing circuit is located in a termination region that is opposite the coupling circuit across the edge memory region.

16. The apparatus of claim 15, further comprising:
   an interface region between the edge memory region and the termination region, the interface region including conductors that electrically couple middle line-portion of the extended digit line to the balancing circuit in the termination region.

17. The apparatus of claim 1, wherein the apparatus comprises a dynamic random-access memory (DRAM) device.

18. A method of operating an apparatus, the method comprising:
   activating a coupling circuit to connect first and second extended digit lines to precharge the extended digit line, wherein
      the first and second extended digit lines are complementary, and
      the first and second extended digit lines have lengths longer than a limit length representative of open-ended digit lines;
   activating balancing circuits connected to the first and second extended digit lines opposite the coupling circuit, wherein activating the balancing circuits includes connecting the first and second extended digit lines to a precharging source to precharge the extended digit line; and
   connecting a memory cell to the first extended digit line after precharging the first extended digit line to determine a bit value represented by an amount of charges stored in the memory cell.

19. The method of claim 18, wherein activating the coupling circuit and activating the balancing circuits are concurrent.

20. The method of claim 19, wherein activating the coupling circuit and activating the balancing circuits comprise controlling a precharging signal connected to control terminals of the coupling circuit and the balancing circuits.

21. The method of claim 18, wherein activating the coupling circuit and activating the balancing circuits comprise precharging the extended digit line from opposing ends based on (1) equalizing complementary voltage levels on the first and second extended digit lines and (2) connecting the first and second extended digit lines to the precharging source.

22. A method of manufacturing an apparatus, the method comprising:
   providing a coupling transistor including forming the coupling transistor in a targeted sensing region;
   providing a balancing transistor separate from the coupling transistor including forming the balancing transistor in an adjacent circuit region separate from the targeted sensing region;
   forming an extended digit line connecting the coupling transistor and a first terminal of the balancing transistor; and
   connecting a second terminal of the balancing transistor to a precharging source;
   wherein:
   the coupling transistor and the balancing transistor are configured to precharge the extended digit line for determining the stored bit value.

23. A method of manufacturing an apparatus, the method comprising:
   providing a coupling transistor;
   providing a balancing transistor separate from the coupling transistor;
   forming an extended digit line connecting the coupling transistor and a first terminal of the balancing transistor, wherein forming the extended digit line includes forming one or more connected sections of Tungsten conductors connecting the coupling transistor and the first terminal of the balancing transistor; and
   connecting a second terminal of the balancing transistor to a precharging source;
   wherein
   the coupling transistor and the balancing transistor are configured to precharge the extended digit line for determining the stored bit value.

24. A method of manufacturing an apparatus, the method comprising:
   providing a coupling transistor;
   providing a balancing transistor separate from the coupling transistor;
   forming an extended digit line connecting the coupling transistor and a first terminal of the balancing transistor, wherein forming the extended digit line includes:
      forming a near portion directly connected to the coupling transistor, wherein the near portion includes a first conductor in an M0 layer;
      forming a middle portion connected to the near portion opposite the coupling transistor, wherein the middle portion includes Tungsten;
      forming an extended portion with one end connected to the middle portion and an opposite end directly connected to the balancing transistor, wherein the extended portion includes a second conductor in a layer different from the M0 layer and the Tungsten; and
   connecting a second terminal of the balancing transistor to a precharging source;
   wherein
   the coupling transistor and the balancing transistor are configured to precharge the extended digit line for determining the stored bit value.

* * * * *